(12) United States Patent
Parry et al.

(10) Patent No.: US 11,062,740 B2
(45) Date of Patent: *Jul. 13, 2021

(54) MEMORY WITH NON-VOLATILE CONFIGURATIONS FOR EFFICIENT POWER MANAGEMENT AND OPERATION OF THE SAME

(71) Applicant: Micron Technology, Inc., Boise, ID (US)

(72) Inventors: Jonathan S. Parry, Boise, ID (US); George B. Raad, Boise, ID (US); James S. Rehmeyer, Boise, ID (US); Timothy B. Cowles, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 18 days.

This patent is subject to a terminal disclaimer.

(21) Appl. No.: 16/834,293

(22) Filed: Mar. 30, 2020

(65) Prior Publication Data

US 2020/0234738 A1 Jul. 23, 2020

Related U.S. Application Data

(63) Continuation of application No. 15/933,687, filed on Mar. 23, 2018, now Pat. No. 10,643,672.

(51) Int. Cl.
*G11C 5/14* (2006.01)
*G11C 7/22* (2006.01)

(52) U.S. Cl.
CPC . *G11C 5/14* (2013.01); *G11C 7/22* (2013.01)

(58) Field of Classification Search
CPC .................................. G11C 5/14; G11C 7/22
See application file for complete search history.

(56) References Cited

U.S. PATENT DOCUMENTS

| | | | |
|---|---|---|---|
| 6,055,208 A | 4/2000 | Morgan et al. | |
| 8,898,374 B2 | 11/2014 | Yang | |
| 10,643,672 B2 * | 5/2020 | Parry | G11C 5/14 |
| 2012/0002499 A1 | 1/2012 | Kinkade et al. | |
| 2015/0262697 A1 | 9/2015 | Kim | |
| 2016/0071674 A1 * | 3/2016 | Kitora | G03G 15/5004 307/140 |
| 2016/0284385 A1 | 9/2016 | Nomura | |
| 2019/0295606 A1 | 9/2019 | Parry et al. | |

* cited by examiner

*Primary Examiner* — Toan K Le
(74) *Attorney, Agent, or Firm* — Perkins Coie LLP

(57) ABSTRACT

A memory device is provided. The memory device comprises a memory array and circuitry configured to determine one or more settings for the memory array corresponding to a powered-on state of the memory device, to store the one or more settings in a non-volatile memory location, and in response to returning to the powered-on state from a reduced-power state, to read the one or more settings from the non-volatile memory location.

24 Claims, 3 Drawing Sheets

MEMORY WITH NON-VOLATILE CONFIGURATIONS FOR EFFICIENT POWER MANAGEMENT AND OPERATION OF THE SAME

CROSS-REFERENCE TO RELATED APPLICATION(S)

This application is a continuation of U.S. patent application Ser. No. 15/933,687, filed Mar. 23, 2018; which is incorporated herein by reference in its entirety.

TECHNICAL FIELD

The present disclosure generally relates to semiconductor memory, and more particularly relates to memory with non-volatile configurations (e.g., dynamic training configurations) for efficient power management and operation of the same.

BACKGROUND

Memory devices are widely used to store information related to various electronic devices such as computers, wireless communication devices, cameras, digital displays, and the like. Memory devices are frequently provided as internal, semiconductor, integrated circuits and/or external removable devices in computers or other electronic devices. There are many different types of memory, including volatile and non-volatile memory. Volatile memory, including random-access memory (RAM), static random access memory (SRAM), dynamic random access memory (DRAM), and synchronous dynamic random access memory (SDRAM), among others, may require a source of applied power to maintain its data. Non-volatile memory, by contrast, can retain its stored data even when not externally powered. Non-volatile memory is available in a wide variety of technologies, including flash memory (e.g., NAND and NOR) phase change memory (PCM), ferroelectric random access memory (FeRAM), resistive random access memory (RRAM), and magnetic random access memory (MRAM), among others. Improving memory devices, generally, may include increasing memory cell density, increasing read/write speeds or otherwise reducing operational latency, increasing reliability, increasing data retention, reducing power consumption, or reducing manufacturing costs, among other metrics.

DETAILED DESCRIPTION

Memory devices can perform memory training and/or initialization operations when powered-on to optimize the timing, voltage, latency, RCOMP resistance, ZQ calibration and/or other settings thereof. These memory training operations can consume many clock cycles during which a memory device is prevented from performing other operations. For memory devices utilizing power-management approaches that alternate between reduced-power and powered-on states, the time consumed by memory training operations after returning to a powered-on state can be detrimental to device performance.

Accordingly, several embodiments of the present technology are directed to memory devices, systems including memory devices, and methods of operating memory devices and systems which enjoy the energy-saving benefits of power management without the delays caused by re-training after returning from a reduced-power state to a powered-on state. In one embodiment of the present technology, a memory device comprising a memory array is provided. The memory device further comprises circuitry configured to determine one or more settings for the memory array corresponding to a powered-on state of the memory device, to store the one or more settings in a non-volatile memory location, and in response to returning to the powered-on state from a reduced-power state, to read the one or more settings from the non-volatile memory location.

Figure 1:
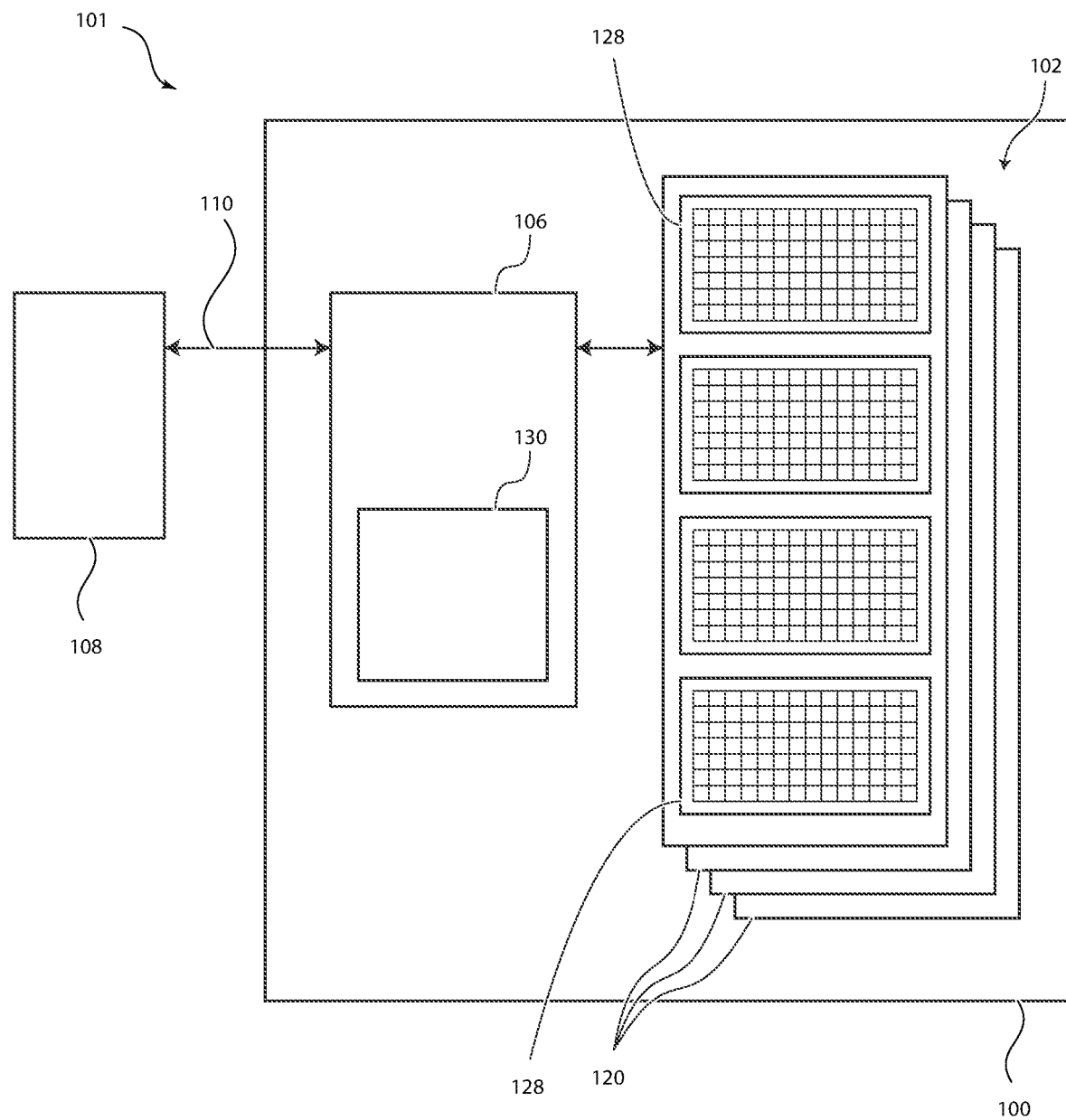
FIG. 1 is a block diagram schematically illustrating a memory system in accordance with an embodiment of the present technology.

FIG. 1 is a block diagram of a system 101 having a memory device 100 configured in accordance with an embodiment of the present technology. As shown, the memory device 100 includes a main memory 102 (e.g., DRAM, NAND flash, NOR flash, MRAM, FeRAM, PCM, etc.) and control circuitry 106 operably coupled to a host device 108 (e.g., an upstream central processor (CPU)). The main memory 102 includes a plurality of memory regions, or memory units 120, which each include a plurality of memory cells. The memory units 120 can be individual memory dies, memory planes in a single memory die, a stack of memory dies vertically connected with through-silicon vias (TSVs), or the like. For example, in one embodiment, each of the memory units 120 can be formed from a semiconductor die and arranged with other memory unit dies in a single device package (not shown). In other embodiments, multiple memory units 120 can be co-located on a single die and/or distributed across multiple device packages. The memory units 120 may, in some embodiments, also be sub-divided into memory regions 128 (e.g., banks, ranks, channels, blocks, pages, etc.).

The memory cells can include, for example, floating gate, charge trap, phase change, capacitive, ferroelectric, magnetoresistive, and/or other suitable storage elements configured to store data persistently or semi-persistently. The main memory 102 and/or the individual memory units 120 can also include other circuit components (not shown), such as multiplexers, decoders, buffers, read/write drivers, address registers, data out/data in registers, etc., for accessing and/or programming (e.g., writing) the memory cells and other functionality, such as for processing information and/or communicating with the control circuitry 106 or the host device 108. The memory cells can be arranged in rows (e.g., each corresponding to a word line) and columns (e.g., each corresponding to a bit line). In other embodiments, the memory cells can be arranged in different types of hierarchies and/or groups than those shown in the illustrated embodiments. Further, although shown in the illustrated embodiments with a certain number of memory cells, rows, columns, blocks, and memory units for purposes of illustration, the number of memory cells, rows, columns, regions, and memory units can vary, and can, in other embodiments, be larger or smaller in scale than shown in the illustrated examples. For example, in some embodiments, the memory device 100 can include only one memory unit 120. Alternatively, the memory device 100 can include two, three, four, eight, ten, or more (e.g., 16, 32, 64, or more) memory units 120. Although the memory units 120 are shown in FIG. 1 as including two memory regions 128 each, in other embodiments, each memory unit 120 can include one, three, four eight, or more (e.g., 16, 32, 64, 100, 128, 256 or more) memory regions.

In one embodiment, the control circuitry 106 can be provided on the same die as the main memory 102 (e.g., including command/address/clock input circuitry, decoders, voltage and timing generators, input/output circuitry, etc.). In another embodiment, the control circuitry 106 can be a microcontroller, special purpose logic circuitry (e.g., a field programmable gate array (FPGA), an application specific integrated circuit (ASIC), control circuitry on a memory die, etc.), or other suitable processor. In one embodiment, the control circuitry 106 can include a processor configured to execute instructions stored in memory to perform various processes, logic flows, and routines for controlling operation of the memory device 100, including managing the main memory 102 and handling communications between the memory device 100 and the host device 108. In some embodiments, the control circuitry 106 can included embedded memory 130 for storing, e.g., memory pointers, fetched data, etc. In another embodiment of the present technology, a memory device may not include control circuitry, and may instead rely upon external control (e.g., provided by the host device 108, or by a processor or controller separate from the memory device).

In operation, the control circuitry 106 can directly write or otherwise program (e.g., erase) the various memory regions of the main memory 102. The control circuitry 106 communicates with the host device 108 over a host-device bus or interface 110. In some embodiments, the host device 108 and the control circuitry 106 can communicate over a dedicated memory bus (e.g., a DRAM bus). In other embodiments, the host device 108 and the control circuitry 106 can communicate over a serial interface, such as a serial attached SCSI (SAS), a serial AT attachment (SATA) interface, a peripheral component interconnect express (PCIe), or other suitable interface (e.g., a parallel interface). The host device 108 can send various requests (in the form of, e.g., a packet or stream of packets) to the control circuitry 106. A request can include a command to read, write, erase, return information, and/or to perform a particular operation (e.g., a TRIM operation, a precharge operation, an activate operation, a wear-leveling operation, a garbage collection operation, etc.).

The host device 108 can be any one of a number of electronic devices capable of utilizing memory for the temporary or persistent storage of information, or a component thereof. For example, the host device 108 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device 108 may be a networking device (e.g., a switch, a router, etc.) or a recorder of digital images, audio and/or video, a vehicle, an appliance, a toy, or any one of a number of other products. In one embodiment, the host device 108 may be connected directly to memory device 100, although in other embodiments, the host device 108 may be indirectly connected to memory device (e.g., over a networked connection or through intermediary devices).

Memory training may be performed at system boot (e.g., when initially powering-on memory system 101), initiated either by the memory device 100 (e.g., by the control circuitry 106) or by the host device 108 (e.g., by a basic input/output system (BIOS) thereof, a unified extensible firmware interface (UEFI) thereof, etc.). Memory training may be used to place a memory data strobe within a data eye for a given memory cycle by establishing programmable latencies and adjusting various timings (e.g., a read timing setting, a write timing setting, a CAS read latency, a CAS write latency, a CMD/CTL/ADDR timing setting, or the like) for memory array 102. Memory training may also be used to adjust one or more operating voltages (e.g. one or more $V_{ref}$ voltages), termination settings (e.g., an on-die termination setting), internal capacitive and resistive impedance compensation (e.g., ZQ calibration setting), or other operating parameters for the memory array 102 or other components of the memory device 100. In accordance with various embodiments of the present technology, memory training may occur on a die by die basis, a byte lane by byte lane basis, on a rank by rank basis, on a channel by channel basis, or across all byte lanes. In alternate embodiments, other groupings of data (e.g., per bit) may be used for memory training.

In some embodiments, main memory 102 can comprise non-volatile memory (e.g., NAND flash, NOR flash, MRAM, FeRAM, PCM, etc.) that, unlike volatile memory, can retain information in the absence of applied power. Accordingly, control circuitry 106 can be configured to enter a reduced-power mode (e.g., a mode in which part or all of the main memory 102 is disconnected from an applied voltage or placed into a reduced power-consuming state) to reduce the power consumption of the memory device 100. For example, the control circuitry 106 can be configured to detect when the memory device is inactive (e.g., when the memory device is not communicating with the host device 108 and/or not performing any memory operations such as reading, writing, erasing, wear leveling, garbage collection, etc.).

One drawback of power-management approaches which cause a memory device 100 to enter a reduced-power state, however, is the inefficiency caused by performing a memory training operation in response to returning the memory device 100 to a full-power (e.g., powered-on) state (e.g., either initiated by a training command sent by host device 108 or in response to the control circuitry 106 detecting the power-on event). As a memory training operation can consume numerous clock cycles (e.g., from one to several hundred clock cycles, or even more) during which the memory device 100 is unable to perform other operations (e.g., read, write, or erase operations requested by the host device 108), the energy-saving benefit of a power-management approach can be offset by a reduction in performance (e.g., increased delays, missed operations, etc.).

Embodiments of the present technology can overcome these drawbacks by providing memory devices with the energy-saving benefits of power management without the delays caused by re-training after returning from a reduced-power state to a powered-on state. In this regard, the control circuitry 106 can be configured to store in a non-volatile location the one or more settings (e.g., a read timing setting, a write timing setting, a CMD/CTL/ADDR timing setting, an ODT setting, a voltage setting, a latency setting, a ZQ calibration, an RCOMP resistance, etc., or any combination thereof) determined in a first memory training operation, and to read the one or more settings from the non-volatile location in lieu of performing a subsequent memory training operation (e.g., when the memory device returns from a reduced-power state to a powered-on state).

In this regard, the control circuitry 106 can be configured to perform a memory training operation, in which are determined one or more settings for the memory array that correspond to a powered-on state of the memory device (e.g., a read timing setting, a write timing setting, a CMD/CTL/ADDR timing setting, an ODT setting, a voltage setting, a latency setting, a ZQ calibration, an RCOMP resistance, etc., or any combination thereof), either in response to a training command received from the host device 108, or in response to the control circuitry 106 detecting that the memory device 100 is entering the powered-on state from a powered-off state. The control circuitry 106 can be further configured to communicate the one or more settings to the host device 108 (e.g., in response to the command received from the host device 108 triggering the memory training operation, so that the host device 108 can use the one or more settings in communicating with or otherwise operating the memory device 100). Alternatively, if the training operation is triggered by the control circuitry 106 detecting a power-on event, the one or more settings may not be communicated to the host device 108 (e.g., in a memory system 101 in which the memory device 100 does not rely upon the host device 108 to manage the main memory 102).

The control circuitry 106 is further configured to store the one or more settings in a non-volatile memory location for later retrieval. In this regard, the non-volatile memory location can be a location in the main memory 102 (e.g., in a memory device 100 in which main memory 102 comprises non-volatile memory such as NAND flash, NOR flash, MRAM, FeRAM, PCM, or some combination thereof), in an embedded memory 130 of the control circuitry 106, or the like. Following the initial training operation (e.g., upon powering-on), subsequent power management cycles (e.g., returning to the powered-on state from a reduced-power state) can be completed without re-training by reading the one or more settings from the non-volatile memory location. In an embodiment in which the host device 108 triggers memory training operations (e.g., subsequent to the initial training) by sending a command to the memory device 100, the control circuitry 106 can, in response to the command, send the one or more settings read from the non-volatile memory location to the host device 108 without re-determining the settings (e.g., without performing another memory training operation).

According to various embodiments of the present technology, power management operations for a memory system 101 can be managed by the memory device 100, the connected host device 108, or both. In this regard, the memory device 100 can be configured to enter a reduced-power state in response to a command from the host device 108 (e.g., a command to shut down, a command to enter a sleep or other low-activity state, etc.) or in response to a determination by the control circuitry 106 that the memory device 100 is idle (e.g., the memory device 100 has neither received a communication from the host device 108 nor been scheduled to perform an operation for more than a threshold amount of time). Similarly, the memory device 100 can be configured to return from the reduced-power state to a powered-on state in response to a command from the host device 108 (e.g., a command to perform a memory operation, a command to power on, wake up, or enter some other higher-energy-consuming state, etc.) and/or in response to a determination by the control circuitry 106 that the memory device 100 is no longer idle (e.g., the memory device 100 receives a communication from the host device 108, is scheduled to perform a background maintenance operation, etc.).

In one embodiment of the present technology, a reduced power state can correspond to a disconnection of at least a portion of the memory device 100 from an applied voltage (e.g., by switching off one or more portions of a voltage distribution tree supplying energy to the main memory 102 and/or other components of memory device 100). In another embodiment of the present technology, a reduced power state can correspond to an operation of the memory device 100 that consumes less power (e.g., by ceasing or slowing one or more operations, such as refresh operations, or by reducing a speed of the memory device, etc.).

Although in the foregoing example embodiments memory devices have been described as storing a single set of one or more settings (e.g., a set of training settings corresponding to a single powered-on state of the memory device), in other embodiments memory devices can be configured to store multiple sets of settings. For example, in a memory device with multiple different powered-on states (e.g., a first powered-on state corresponding to a first operating speed, voltage, and/or power consumption, etc. and a second powered-on state corresponding to a second operating speed, voltage, and/or power consumption, etc.), the control circuitry 106 can be configured to store different sets of training settings (e.g., each set including one or more settings corresponding to the related powered-on state) for retrieval from non-volatile storage without retraining upon entering the corresponding powered-on state.

Although in the foregoing example embodiments power management approaches for memory devices with non-volatile memories have been described, in other embodiments of the present technology similar power management approaches can be applied to memory devices with volatile memories. For example, although volatile memory may require the application of an external voltage to maintain data integrity, portions (e.g., dies, channels, banks, ranks, etc.) of a volatile memory array in which no valid data is stored can be placed into a reduced-power state and restored to a powered-on state as set forth in greater detail above without the risk of data loss. By storing the settings corresponding to that volatile memory portion in a non-volatile memory location (e.g., an embedded memory 130 in the control circuitry 106), the foregoing approaches can be applied to a volatile memory with similar benefits (e.g., the energy-saving benefits of power management without the delays of repeated memory training operations).

Figure 2:
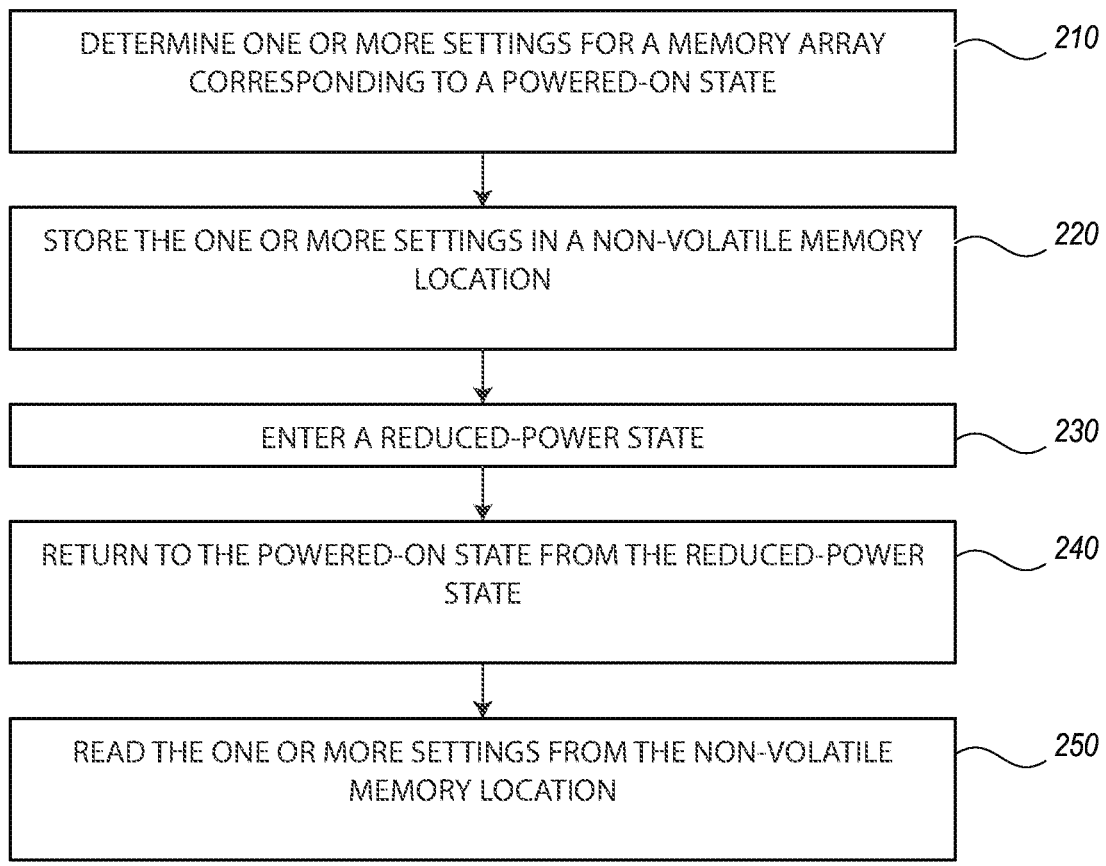
FIG. 2 is a flow chart illustrating a method of operating a memory device in accordance with an embodiment of the present technology.

FIG. 2 is a flow chart illustrating a method of operating a memory device in accordance with an embodiment of the present technology. The method includes determining one or more settings for a memory array corresponding to a powered-on state of the memory device (box 210) and storing the one or more settings in a non-volatile memory location (box 220). In accordance with one aspect of the present technology, the one or more settings can include a read timing setting, a write timing setting, a CMD/CTL/ADDR timing setting, an ODT setting, a voltage setting, a latency setting, a ZQ calibration, an RCOMP resistance, or a combination thereof. In accordance with another aspect, determining the one or more settings for the memory array can be performed in response to entering the powered-on state from a powered-off state. The method further includes entering a reduced-power state (box 230) and returning to the powered-on state from the reduced-power state (box 240). In accordance with one aspect of the present technology, a reduced power state can correspond to a disconnection of at least a portion of the memory device from an applied voltage and/or a mode of operating the memory device that consumes less power than another mode of operation. The method further includes, in response to returning to the powered-on state from the reduced-power state, reading the one or more settings from the non-volatile memory location (box 250). In accordance with one embodiment of the present technology, the reading operation of box 250 can be performed without re-determining the one or more settings.

Figure 3:
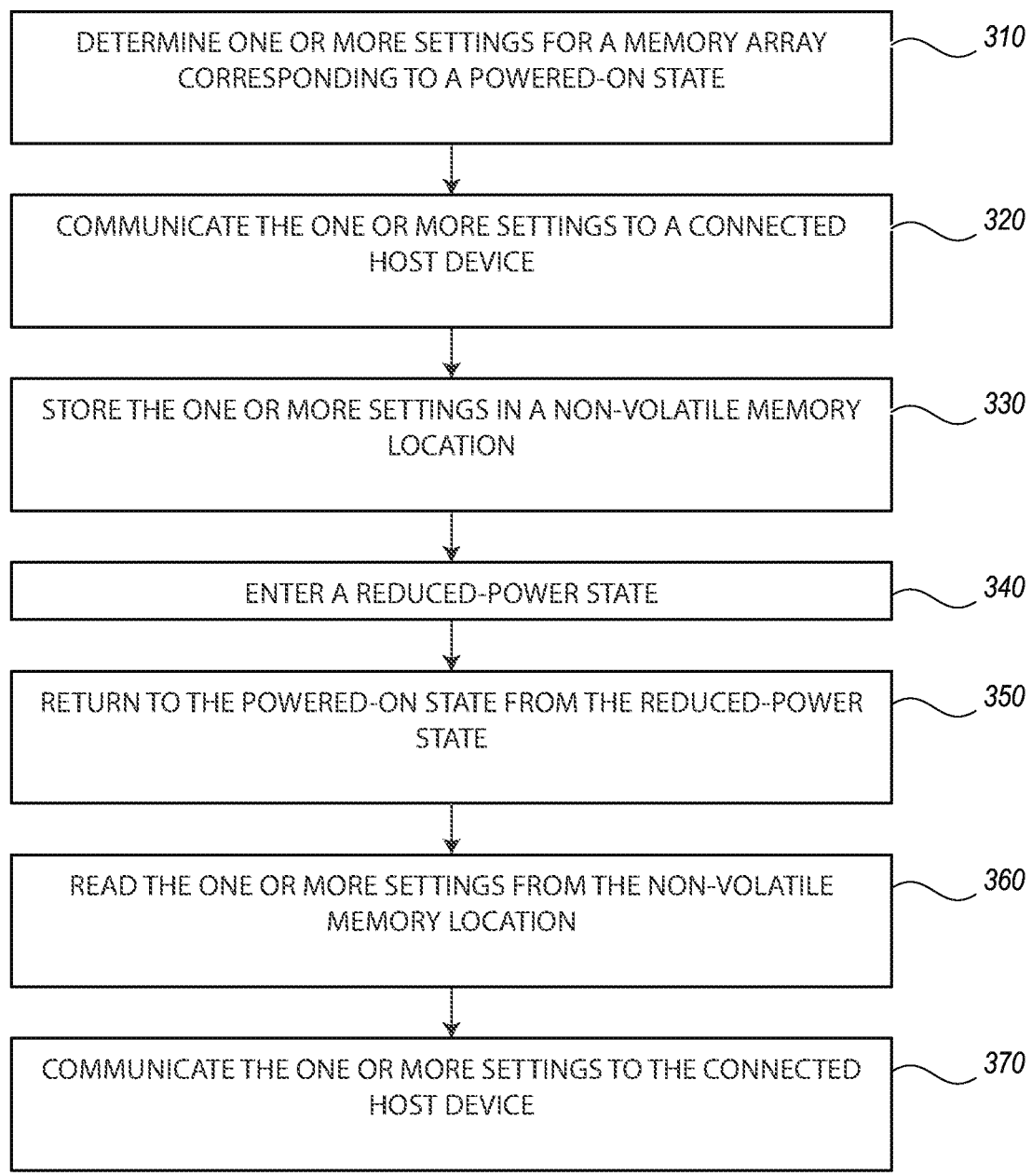
FIG. 3 is a flow chart illustrating a method of operating a memory device in accordance with an embodiment of the present technology.

FIG. 3 is a flow chart illustrating a method of operating a memory device in accordance with an embodiment of the present technology. The method includes determining one or more settings for a memory array corresponding to a powered-on state of the memory device (box 310), communicating the one or more settings to a connected host device (box 320) and storing the one or more settings in a non-volatile memory location (box 330). In accordance with another aspect, determining the one or more settings for the memory array can be performed in response to a command from the host device. The method further includes entering a reduced-power state (box 340) and returning to the powered-on state from the reduced-power state (box 350). In accordance with one aspect of the present technology, entering into a reduced power and returning to a powered-on state can be performed in response to commands received from the connected host device. The method further includes, in response to returning to the powered-on state from the reduced-power state, reading the one or more settings from the non-volatile memory location (box 360) and communicating the one or more settings to the connected host device (box 370). In accordance with one embodiment of the present technology, the reading operation of box 360 can be performed without re-determining the one or more settings.

It should be noted that the methods set forth above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A memory device, comprising:
a memory array; and
circuitry configured to:
perform a memory training operation on the memory array to determine one or more memory training settings for the memory array;
store the one or more memory training settings in a non-volatile memory location; and
in response to returning to a powered-on state from a reduced-power state, read the one or more memory training settings from the non-volatile memory location.

2. The memory device of claim 1, wherein the circuitry is further configured, in response to returning to the powered-on state from the reduced-power state, to read the one or more memory training settings from the non-volatile memory location without performing another memory training operation to determine the one or more memory training settings.

3. The memory device of claim 1, wherein the memory training operation is configured to place a memory data strobe within a data eye for a given memory cycle of the memory array by establishing one or more programmable latencies for the memory array and adjusting one or more timings for the memory array.

4. The memory device of claim 1, wherein the one or more memory training settings include a read timing setting, a write timing setting, a CMD/CTL/ADDR timing setting, an ODT setting, a voltage setting, a latency setting, a ZQ calibration, an RCOMP resistance, or a combination thereof.

5. The memory device of claim 1, wherein the circuitry is configured to perform the memory training operation in response to receiving a command from a connected host device.

6. The memory device of claim 5, wherein the circuitry is further configured to communicate the one or more memory training settings to the connected host device in response to the command.

7. The memory device of claim 1, wherein the circuitry is configured to perform the memory training operation in response to entering the powered-on state from a powered-off state.

8. The memory device of claim 1, wherein the circuitry is further configured to cause the memory device to enter the reduced-power state in response to receiving a command from a connected host device.

9. The memory device of claim 1, wherein the circuitry is further configured to cause the memory device to enter the reduced-power state in response to a determination that the memory device is idle.

10. The memory device of claim 1, wherein the circuitry is further configured to cause the memory device to return to the powered-on state from the reduced-power state in response to receiving a command from a connected host device.

11. The memory device of claim 1, wherein the reduced-power state corresponds to a disconnection of at least a portion of the memory array from an applied voltage.

12. The memory device of claim 1, wherein a single semiconductor chip comprises the circuitry and the memory array.

13. The memory device of claim 1, wherein a first semiconductor chip comprises the circuitry and a second one or more semiconductor chips comprise the memory array.

14. A method of operating a memory device including a memory array, the method comprising:
   performing a memory training operation to determine one or more memory training settings for the memory array;
   storing the one or more memory training settings in a non-volatile memory location; and
   in response to returning to the powered-on state from a reduced-power state, reading the one or more memory training settings from the non-volatile memory location.

15. The method of claim 14, further comprising:
   in response to returning to the powered-on state from the reduced-power state, reading the one or more memory training settings from the non-volatile memory location without performing another memory training operation to determine the one or more memory training settings.

16. The method of claim 14, wherein the memory training operation is configured to place a memory data strobe within a data eye for a given memory cycle of the memory array by establishing one or more programmable latencies for the memory array and adjusting one or more timings for the memory array.

17. The method of claim 14, wherein the one or more memory training settings include a read timing setting, a write timing setting, a CMD/CTL/ADDR timing setting, an ODT setting, a voltage setting, a latency setting, a ZQ calibration, an RCOMP resistance, or a combination thereof.

18. The method of claim 14, wherein performing the memory training operation is performed in response to receiving a command from a connected host device.

19. The method of claim 18, further comprising:
   communicating the one or more memory training settings to the connected host device in response to the command.

20. The method of claim 14, wherein performing the memory training operation is performed in response to entering the powered-on state from a powered-off state.

21. The method of claim 14, further comprising:
   entering the reduced-power state in response to a determination that the memory device is idle.

22. The method of claim 20, further comprising:
   returning to the powered-on state from the reduced-power state in response to receiving a command from a connected host device.

23. A memory system, comprising:
   a host device; and
   a memory device including a memory array operably coupled to the host device, the memory device configured to:
      perform a memory training operation to determine one or more memory training settings for the memory array;
      store the one or more settings in a non-volatile memory location; and
      in response to returning to the powered-on state from a reduced-power state, read the one or more memory training settings from the non-volatile memory location.

24. The memory system of claim 23, wherein the memory device is further configured to, in response to returning to the powered-on state from the reduced-power state, communicate the one or more memory training settings to the host device after reading the one or more memory training settings from the non-volatile memory location.

* * * * *